(12) United States Patent  
Sunaga

(10) Patent No.: US 10,243,289 B2  
(45) Date of Patent: Mar. 26, 2019

(54) PLUG CONNECTOR HAVING SIGNAL AND GROUND PINS EACH WITH A CURVED AND A FLAT PORTION ARRANGED ON BOTH SIDES OF A BOARD

(71) Applicant: Hitachi Metals, Ltd., Minato-ku, Tokyo (JP)

(72) Inventor: Yoshinori Sunaga, Hitachinaka (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 15/692,360

(22) Filed: Aug. 31, 2017

(65) Prior Publication Data

US 2018/0069333 A1   Mar. 8, 2018

(30) Foreign Application Priority Data

Sep. 2, 2016   (JP) .................................. 2016-172102

(51) Int. Cl.  
| H01R 29/00 | (2006.01) |
| H01R 12/72 | (2011.01) |
| H01R 9/24 | (2006.01) |
| H01R 13/6583 | (2011.01) |
| H01R 13/6587 | (2011.01) |
| H01R 12/70 | (2011.01) |

(Continued)

(52) U.S. Cl.  
CPC ......... *H01R 12/721* (2013.01); *H01R 9/2458* (2013.01); *H01R 12/7082* (2013.01); *H01R 13/6583* (2013.01); *H01R 13/6587* (2013.01); *H01R 43/205* (2013.01); *H05K 1/117* (2013.01); *H05K 3/368* (2013.01); *G02B 6/3885* (2013.01); *G02B 6/4284* (2013.01); *H01R 13/6597* (2013.01); *H05K 2201/10189* (2013.01)

(58) Field of Classification Search  
CPC ........ H01R 9/096; H01R 9/22; H01R 9/2408; H01R 9/2458; H01R 12/52; H01R 12/7076; H01R 12/721; H01R 13/5814; H01R 13/6583; H01R 12/7082; H01R 13/6587; H01R 43/205; H05K 1/117; H05K 3/368  
USPC .............................. 439/49, 65, 74, 660, 267  
See application file for complete search history.

(56) References Cited

U.S. PATENT DOCUMENTS 5,556,283 A * 9/1996 Stendardo .............. G09B 5/062  
434/169  
8,177,564 B1 * 5/2012 Ito ...................... H01R 13/6471  
439/108

(Continued)

FOREIGN PATENT DOCUMENTS

JP   2013-84577 A   5/2013

*Primary Examiner* — Chandrika Prasad  
(74) *Attorney, Agent, or Firm* — Crowell & Moring LLP

(57) ABSTRACT

A communication module includes a plug connector provided with upper connection pins and lower connection pins. The upper connection pins and the lower connection pins include signal pins each connected to a signal line arranged in a module board, and ground pins each connected to a ground line arranged in the module board. An opposing interval between a terminal end of a rear end portion of each of the ground pins included in the upper connection pins, and a terminal end of a rear end portion of each of the ground pins included in the lower connection pins is longer than an opposing interval between a terminal end of a rear end portion of each of the signal pins included in the upper connection pins and a terminal end of a rear end portion of each of the signal pins included in the lower connection pins.

7 Claims, 7 Drawing Sheets

(51) Int. Cl.
    *H01R 43/20*     (2006.01)
    *H05K 1/11*     (2006.01)
    *H05K 3/36*     (2006.01)
    *G02B 6/38*     (2006.01)
    *G02B 6/42*     (2006.01)
    *H01R 13/6597*     (2011.01)

(56) References Cited

U.S. PATENT DOCUMENTS

| | | | | |
|---|---|---|---|---|
| 8,523,583 | B2 * | 9/2013 | Ito | H01R 12/721 439/108 |
| 9,431,768 | B1 * | 8/2016 | Champion | H01R 13/6471 |
| 9,472,900 | B1 * | 10/2016 | Phillips | H01R 13/6471 |
| 9,531,129 | B2 * | 12/2016 | de Boer | H01R 13/6471 |
| 9,531,130 | B1 * | 12/2016 | Phillips | H01R 13/6471 |
| 9,666,990 | B1 * | 5/2017 | de Boer | H01R 13/6471 |
| 9,692,183 | B2 * | 6/2017 | Phillips | H01R 13/6471 |
| 9,768,557 | B2 * | 9/2017 | Phillips | H01R 13/6585 |
| 9,859,658 | B2 * | 1/2018 | Champion | H01R 13/6471 |
| 2009/0291596 | A1 * | 11/2009 | Miyazoe | H01R 12/721 439/636 |
| 2013/0089991 | A1 | 4/2013 | Ito | |

\* cited by examiner

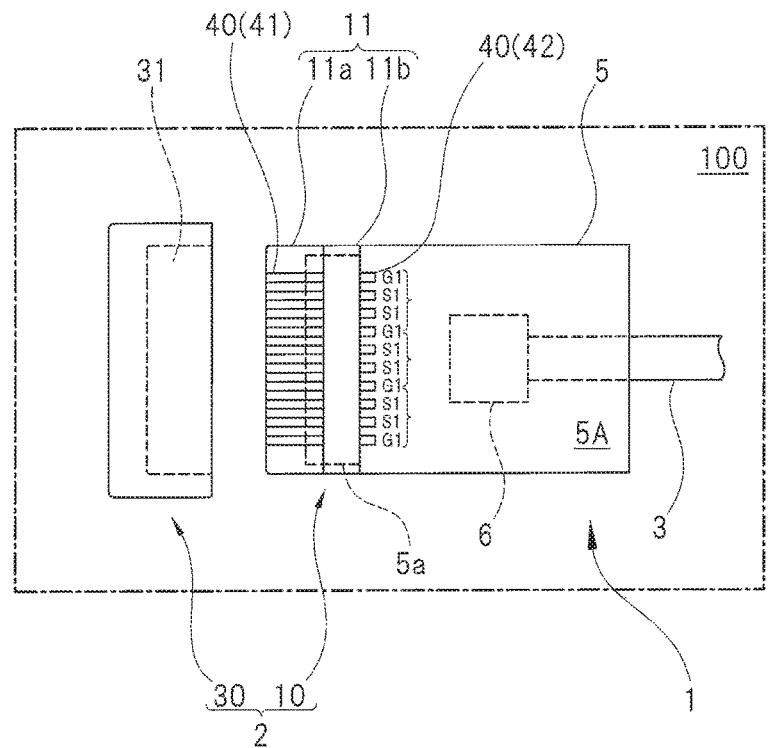
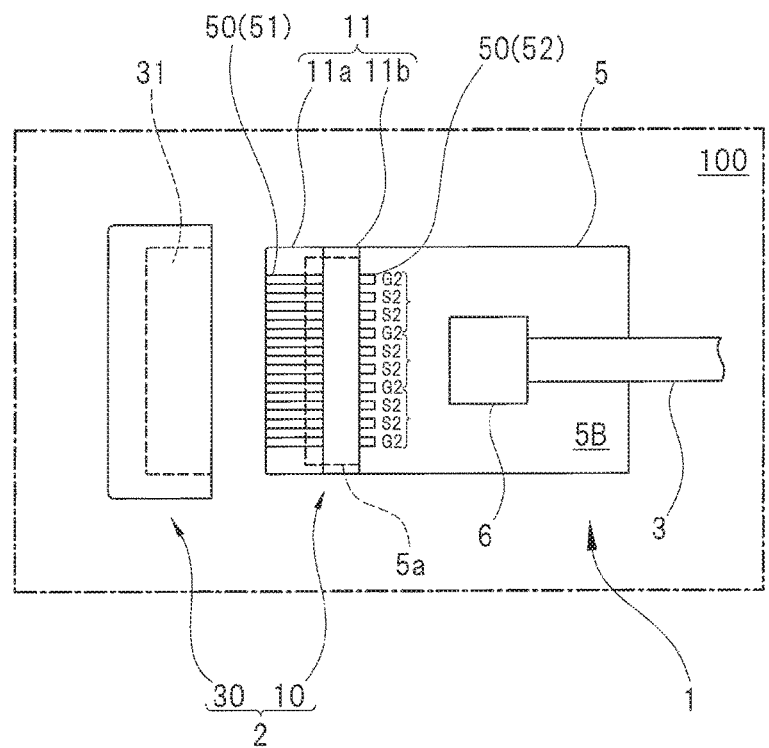

PLUG CONNECTOR HAVING SIGNAL AND GROUND PINS EACH WITH A CURVED AND A FLAT PORTION ARRANGED ON BOTH SIDES OF A BOARD

CROSS-REFERENCE TO RELATED APPLICATION

The present application claims priority from Japanese Patent Application No. 2016-172102 filed on Sep. 2, 2016, the content of which is hereby incorporated by reference into this application.

TECHNICAL FIELD OF THE INVENTION

The present invention relates to a communication module used for optical communication and telecommunications.

BACKGROUND OF THE INVENTION

So-called communication apparatuses such as servers and network equipment include a board with which a communication module is connected. Such a board is generally referred to as a "motherboard" or a "host board." Hereinafter, a board included in a communication apparatus and with which a communication module is connected will be referred to as a "motherboard."

For a connector connecting the communication module and the motherboard, a two-piece structure connector including a male connector (plug connector) and a female connector (receptacle connector) has been used in many cases. Further, when the two-piece structure connector is used to connect the communication module and the motherboard, the plug connector is arranged in the communication module, and the receptacle connector is arranged on the motherboard, in many cases.

The plug connector arranged in the communication module includes an insertion projection portion inserted in the receptacle connector. The insertion projection portion is provided with a plurality of connection pins connected to a plurality of connection pins provided in the receptacle connector. These connection pins are electrically connected with a board housed in a housing of the communication module. The board housed in the housing of the communication module will be referred to as a "module board" below and distinguished from the board (motherboard) of the communication apparatus.

At an end of the module board, a plurality of connection pads forming an edge connector are arranged. When the plug connector and the module board are coupled, the connection pins provided on the insertion projection portion of the plug connector contact the connection pads arranged at the end of the module board to be electrically connected.

More specifically, a plurality of upper connection pins aligned in one row and a plurality of lower connection pins aligned in one row are provided in the plug connector, and the row of the upper connection pins and the row of the lower connection pins are opposed to each other across a gap. Further, the end of the module board provided with the edge connector is inserted in a gap between the row of the upper connection pins and the row of the lower connection pins.

In this regard, the gap between the row of the upper connection pins and the row of the lower connection pins is narrower than a thickness of the module board. In other words, an opposing interval between the upper connection pin and the lower connection pin is narrower than the thickness of the module board. Hence, the end of the module board inserted in the gap between the row of the upper connection pins and the row of the lower connection pins enters deep inside the gap, pushing away the upper connection pins and the lower connection pins opposed to each other in a direction in which the upper connection pins and the lower connection pins move away from each other. As a result, when the end of the module board is inserted in the gap between the row of the upper connection pins and the row of the lower connection pins, the upper connection pins and the lower connection pins come into pressure contact with the corresponding connection pads by elastic restoring forces of the upper connection pins and the lower connection pins. (Japanese Patent Application Laid-Open Publication No. 2013-84577)

SUMMARY OF THE INVENTION

As described above, the gap between the row of the upper connection pins and the row of the lower connection pins is narrower than the thickness of the module board. Therefore, time and effort are required to insert the end of the module board in the gap. That is, time and effort are required to assemble the plug connector. When, for example, the end of the module board and the gap between the row of the upper connection pins and the row of the lower connection pins are not accurately aligned, the end of the module board interferes with the upper connection pins and the lower connection pins. Therefore, it is not possible to insert the end of the module board in the gap.

Meanwhile, when the gap between the row of the upper connection pins and the row of the lower connection pins is too wide, pressure contact forces of the upper connection pins and the lower connection pins against the connection pads become insufficient. Further, after the end of the module board is inserted in the gap between the row of the upper connection pins and the row of the lower connection pins, a large gap occurs between an end of each of the upper connection pins and the lower connection pins, and the module board. Then, the end of each of the upper connection pins and the lower connection pins becomes stubs, thereby causing deterioration of electric characteristics.

An object of the present invention is to facilitate assembling of a plug connector provided in a communication module without deteriorating electric characteristics.

A communication module of the present invention includes a plug connector connected to a receptacle connector of a communication apparatus. The plug connector includes: an insertion projection portion inserted in the receptacle connector; a flange portion including a front end surface to which the insertion projection portion is continuously connected, and a back end surface opposite to the front end surface; a plurality of first connection pins each including a front end portion protruding from the front end surface of the flange portion and extending along an upper surface of the insertion projection portion, and a rear end portion protruding from the back end surface of the flange portion; a plurality of second connection pins each including a front end portion protruding from the front end surface of the flange portion and extending along a lower surface of the insertion projection portion, and a rear end portions protruding from the back end surface of the flange portion; and a board inserted between the rear end portion of the first connection pin and the rear end portion of the second connection pin. The plurality of first connection pins and the plurality of second connection pins include signal pins each connected to a signal line arranged in the board, and ground pins each connected to a ground line arranged in the board. Then, an opposing interval between a terminal end of the rear end portion of each of the ground pins included in the first connection pins and a terminal end of the rear end portion of each of the ground pins included in the second connection pins is longer than an opposing interval between a terminal end of the rear end portion of each of the signal pins included in the first connection pins and a terminal end of the rear end portion of each of the signal pins included in the second connection pins.

According to the present invention, it is possible to facilitate assembling of a plug connector provided in a communication module without deteriorating electric characteristics.

BRIEF DESCRIPTIONS OF THE DRAWINGS

FIG. 3A is a plan view schematically illustrating the internal structure of the communication module illustrated in FIG. 1;

FIG. 3B is a bottom view schematically illustrating the internal structure of the communication module illustrated in FIG. 1;

DESCRIPTIONS OF THE PREFERRED EMBODIMENTS

One example of an embodiment of the present invention will be described in detail below. A communication module according to the present embodiment is connected with a motherboard of a communication apparatus. More specifically, the communication module according to the present embodiment includes a male connector inserted and removed in and from a female connector arranged on the motherboard of the communication apparatus. That is, the communication module according to the present embodiment and the motherboard of the communication apparatus are connected via a two-piece structure connector. Hereinafter, the male connector arranged in the communication module will be referred to as a "plug connector," the female connector arranged on the motherboard will be referred to as a "receptacle connector," and both may be collectively referred to as a "connector."

A communication semiconductor chip is mounted on the motherboard of the communication apparatus, and the communication module connected with the motherboard is connected with the communication semiconductor chip via an electric wire formed in the motherboard. Further, a plurality of receptacle connectors are disposed on the motherboard, and a plurality of communication modules are connected with the communication semiconductor chip via the respective receptacle connectors.

Figure 1:
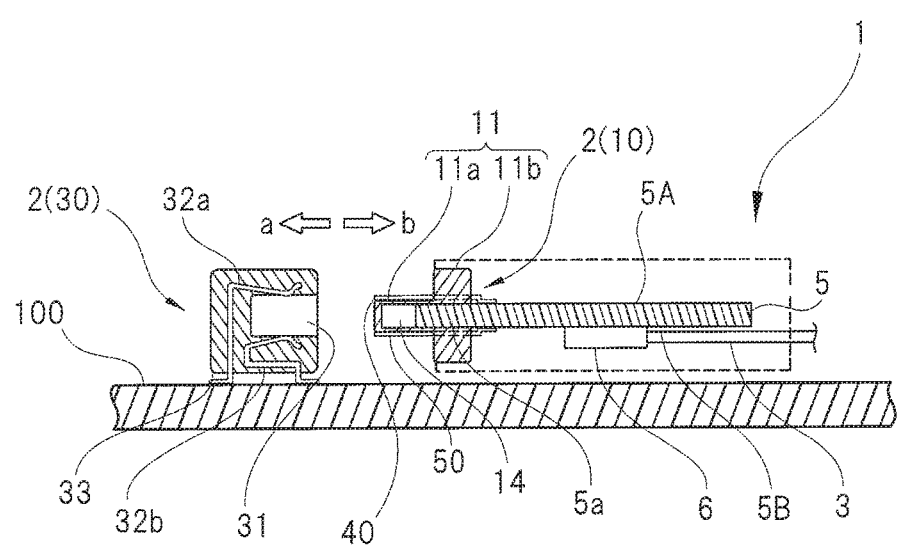
FIG. 1 is a cross-sectional view illustrating an example of a communication module to which the present invention is applied.

As illustrated in FIG. 1, a plug connector 10 arranged in a communication module 1 according to the present embodiment includes a connector housing 11 provided with an insertion projection portion 11a and a flange portion 11b, first connection pins 40 attached to an upper surface side of the connector housing 11, and second connection pins 50 attached to a lower surface side of the connector housing 11.

Meanwhile, a receptacle connector 30 arranged on a motherboard 100 includes a connector housing 33 in which an insertion recess portion 31 is formed and connection pins 32a and 32b are buried. The insertion projection portion 11a of the plug connector 10 is inserted in the insertion recess portion 31 of the receptacle connector 30 along an arrow a direction (insertion direction) illustrated in FIG. 1, and is removed from the insertion recess portion 31 of the receptacle connector 30 along an arrow b direction (removal direction). When the insertion projection portion 11a of the plug connector 10 is inserted in the insertion recess portion 31 of the receptacle connector 30, the connection pins provided in both of the connectors contact with each other. More specifically, the first connection pins 40 of the plug connector 10 and the connection pins 32a of the receptacle connector 30 contact with each other, and the second connection pins 50 of the plug connector 10 and the connection pins 32b of the receptacle connector 30 contact with each other. Thus, the communication module 1 and the motherboard 100 are electrically connected via a connector 2 (the plug connector 10 and the receptacle connector 30). Consequently, it is possible to transmit and receive (input and output) signals between the communication module 1 and a communication semiconductor chip mounted on the motherboard 100.

Figure 2:
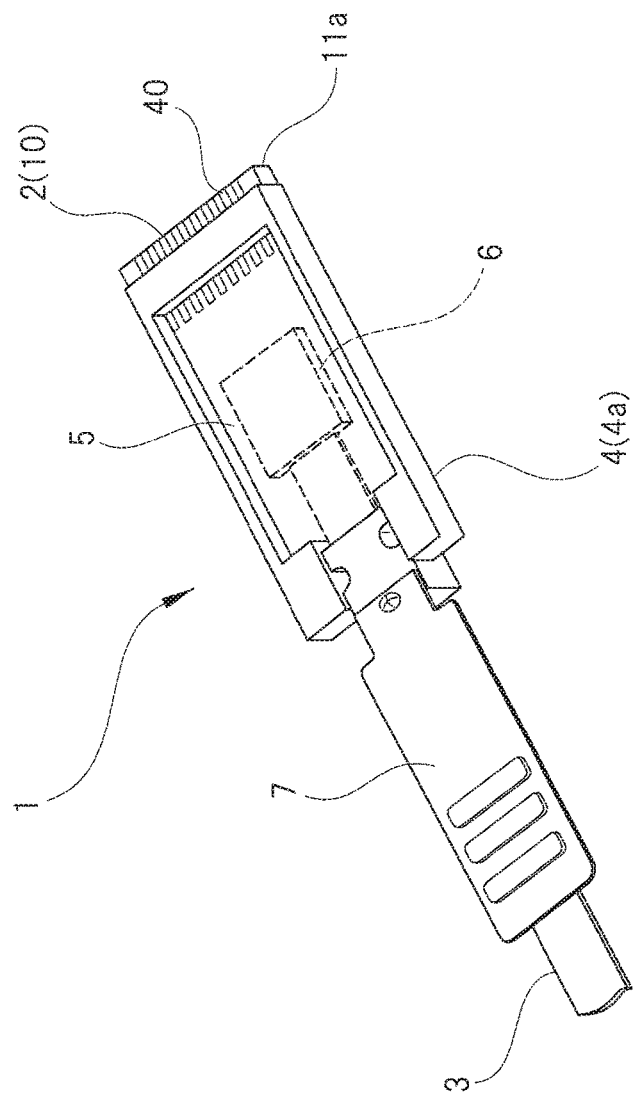
FIG. 2 is a perspective view schematically illustrating an internal structure of the communication module illustrated in FIG. 1.

As illustrated in FIG. 2, the communication module 1 includes a housing 4 in which one end of an optical fiber (fiber ribbon) 3 is drawn, and a module board 5 housed in the housing 4. A photoelectric converting unit 6 is mounted on aback surface 5B (FIG. 1) of the module board 5. Note that the housing 4 is formed by a lower case 4a illustrated and an upper case not illustrated. The lower case 4a and the upper case are butted against each other to form the housing 4 including a space capable of housing the module board 5.

Further, although not illustrated, the photoelectric converting unit 6 includes at least a light emitting element, a drive IC driving the light emitting element, a light receiving element, and an amplifying IC amplifying electrical signals output from the light receiving element. Further, a lens block optically coupling the light emitting element and the light receiving element, and the optical fiber 3 is also provided in the module board 5. The one end of the optical fiber 3 drawn in the housing 4 is connected (optically connected) with the lens block via a MT (Mechanically Transferable) connector. More specifically, a leading end surface of the MT connector is abutted on an abutting surface of the lens block. Further, a pair of guide pins protrudes from the abutting surface of the lens block, and these guide pins are inserted in guide holes formed in the leading end surface of the MT connector. Note that, in the present embodiment, a VCSEL (Vertical Cavity Surface Emitting Laser) is used for the light emitting element, and a PD (Photodiode) is used for the light receiving element. However, the light emitting element and the light receiving element are not limited to specific light emitting elements and light receiving elements. Further, a pull-tab 7 pinched to pull the plug connector 10 out from the receptacle connector 30 (FIG. 1) is attached to a rear end of the housing 4.

Referring to FIG. 1 again, the insertion projection portion 11a of the plug connector 10 has a tabular shape, and the flange portion 11b is integrally formed at the back of the insertion projection portion 11a. That is, the insertion projection portion 11a is continuously connected to a front end surface 12 (FIGS. 4A and 4B) of the flange portion 11b, and protrudes from the front end surface 12 of the flange portion 11b. In other words, the surface to which the insertion projection portion 11a is continuously connected is the front end surface 12 of the flange portion 11b, and a surface on a side opposite to the front end surface 12 is a back end surface 13 (FIGS. 4A and 4B) of the flange portion 11b.

FIG. 3A is a plan view illustrating a side of a front surface 5A of the module board 5. FIG. 3B is a bottom view illustrating a side of the back surface 5B of the module board 5. As illustrated in FIGS. 3A and 3B, widths of the insertion projection portion 11a and the flange portion 11b are the same as the maximum width of the module board 5. In other words, a width of the plug connector 10 is the same as the maximum width of the module board 5. That is, the plug connector 10 does not protrude to both outer sides of the module board 5, and both side surfaces of the plug connector 10 are flush or substantially flush with both side surfaces of the module board 5.

As illustrated in FIG. 1, a part of the module board 5 is inserted inside the plug connector 10. More specifically, a board insertion portion 14 opened in the back end surface 13 (FIGS. 4A and 4B) of the flange portion 11b is formed in the connector housing 11. A shape of this board insertion portion 14 matches with a shape of an end of the module board 5, and the end of the module board 5 is inserted in the board insertion portion 14. More specifically, as illustrated in FIGS. 3A and 3B, an insertion end 5a having a slightly narrower width than other portions is formed at one end in a longitudinal direction of the module board 5, and this insertion end 5a is inserted in the board insertion portion 14 (FIG. 1).

Figure 4A:
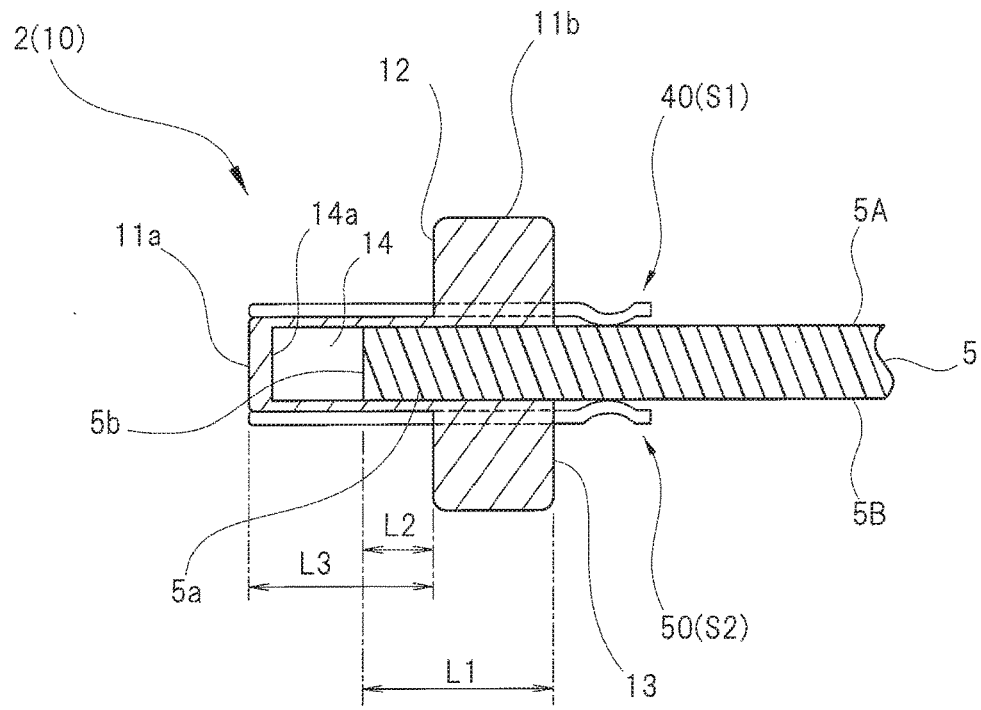
FIG. 4A is an enlarged cross-sectional view along signal pins illustrating a state where an end of a module board is inserted in an insertion projection portion.
Figure 4B:
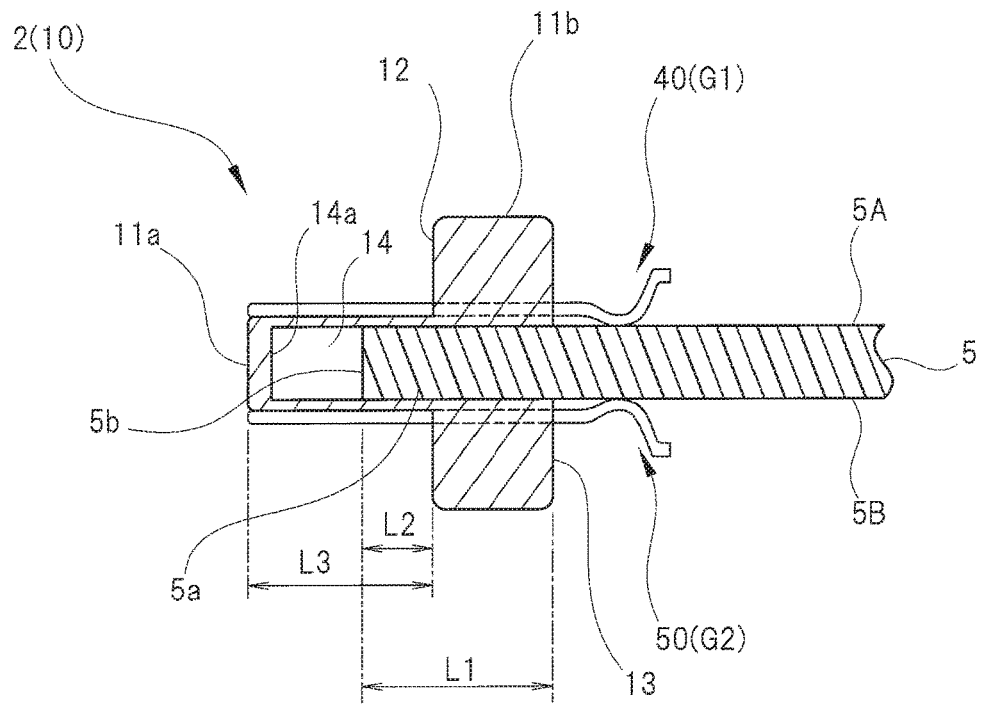
FIG. 4B is an enlarged cross-sectional view along ground pins illustrating a state where the end of the module board is inserted in the insertion projection portion.

In this regard, as illustrated in FIGS. 4A and 4B, a leading end surface 5b of the module board 5 (insertion end 5a) does not abut on a bottom surface 14a of the board insertion portion 14. That is, a part of an entire length (L1) of the insertion end 5a enters inside the insertion projection portion 11a beyond the front end surface 12 of the flange portion 11b. In the present embodiment, an insertion length (L2) of the insertion end 5a with respect to the insertion projection portion 11a is approximately ½ of an entire length (L3) of the insertion projection portion 11a.

In this regard, the connector housing 11 is manufactured by an injection molding method, and the board insertion portion 14 has high dimensional accuracy. Hence, the insertion end 5a of the module board 5 inserted in the board insertion portion 14 is fixed strongly and precisely to the connector housing 11. That is, the plug connector 10 and the module board 5 are fixed strongly and precisely.

As illustrated in FIG. 3A, the plurality of first connection pins 40 are arranged on the upper surface side of the connector housing 11. Further, as illustrated in FIG. 3B, the plurality of second connection pins 50 are arranged on a bottom surface side of the connector housing 11. The first connection pins 40 will be referred to as the "upper connection pins 40," and the second connection pins 50 will be referred to as the "lower connection pins 50" below. The plurality of upper connection pins 40 and the plurality of lower connection pins 50 are each aligned in one row at a predetermined pitch (0.5 mm in the present embodiment) along a width direction of the plug connector 10.

As illustrated in FIG. 3A, each of the upper connection pins 40 has a strip shape and penetrates the flange portion 11b. Each of the upper connection pins 40 includes a front end portion 41 protruding from the front end surface 12 of the flange portion 11b and extending along an upper surface of the insertion projection portion 11a, and a rear end portion 42 protruding from the back end surface 13 of the flange portion 11b. Further, the plurality of upper connection pins 40 includes signal pins S1 each connected to a signal line arranged in the module board 5, and ground pins G1 each connected to a ground line arranged in the module board 5. That is, the plurality of upper connection pins 40 include the signal pins S1 and the ground pins G1, and each of the signal pins S1 and the ground pins G1 includes the front end portion 41 and the rear end portion 42. The signal pins S1 and the ground pins G1 included in the upper connection pins 40 will be referred to as the "upper signal pins S1" and the "upper ground pins G1," respectively, below.

As illustrated in FIG. 3B, each of the lower connection pins 50 also has a strip shape and penetrates the flange portion 11b. Each of the lower connection pins 50 includes a front end portion 51 protruding from the front end surface 12 of the flange portion 11b and extending along a lower surface of the insertion projection portion 11a, and a rear end portion 52 protruding from the back end surface 13 of the flange portion 11b. Further, the plurality of lower connection pins 50 include signal pins S2 each connected to the signal line arranged in the module board 5, and ground pins G2 each connected to the ground line arranged in the module board 5. That is, the plurality of lower connection pins 50 include the signal pins S2 and the ground pins G2, and each of the signal pins S2 and the ground pins G2 includes the front end portion 51 and the rear end portion 52. The signal pins S2 and the ground pins G2 included in the lower connection pins 50 will be referred to as the "lower signal pins S2" and the "lower ground pins G2," respectively, below.

As illustrated in FIG. 3A, four of the upper signal pins S1 and the upper ground pins G1 form one group. In each group, the upper ground pin G1, the upper signal pin S1, the upper signal pin S1, and the upper ground pin G1 are arranged in this order. Further, as illustrated in FIG. 3B, four of the lower signal pins S2 and the lower ground pins G2 included in the lower connection pins 50 also form one group. In each group, the lower ground pin G2, the lower signal pin S2, the lower signal pin S2, and the lower ground pin G2 are arranged in this order. That is, the ground pins are disposed on both outer sides of the two adjacent signal pins. In the present embodiment, a pair of differential signals is transmitted to the two adjacent signal pins S1.

Figure 5A:
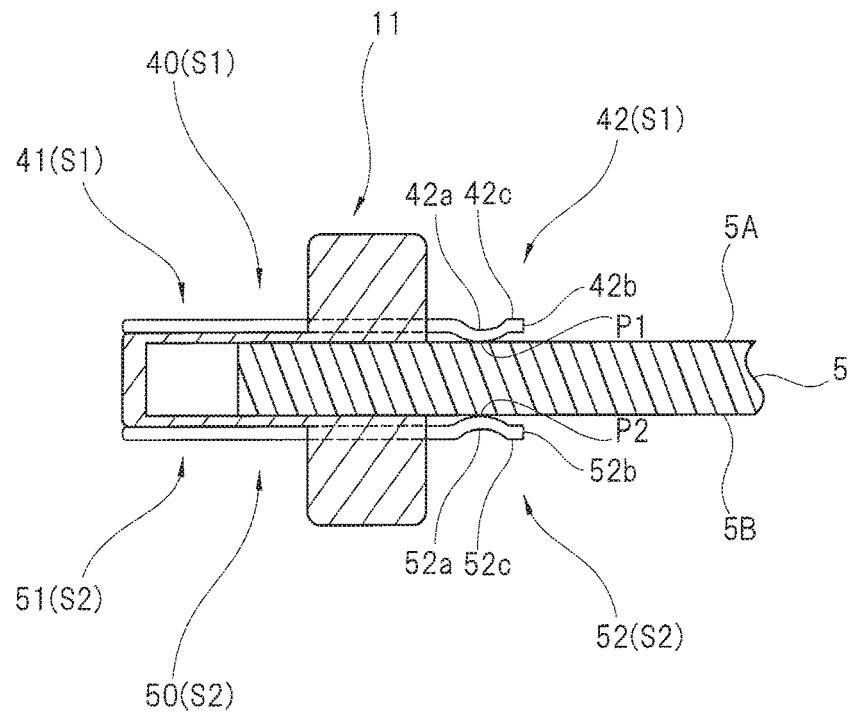
FIG. 5A is an enlarged cross-sectional view illustrating upper signal pins and lower signal pins.
Figure 5B:
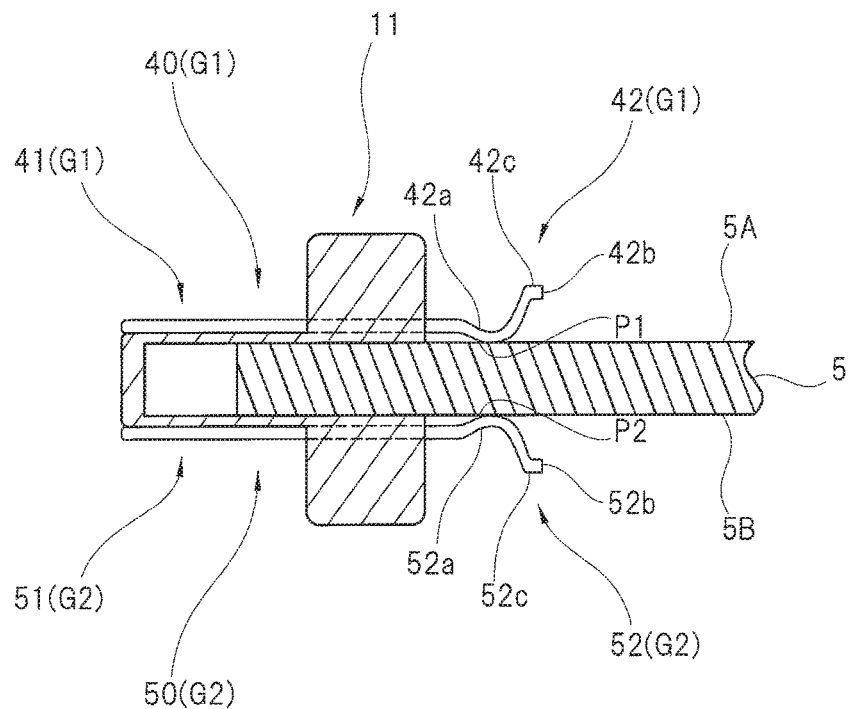
FIG. 5B is an enlarged cross-sectional view illustrating upper ground pins and lower ground pins.

As illustrated in FIGS. 5A and 5B, the end of the module board 5 is inserted between the rear end portions 42 of the upper connection pins 40 and the rear end portions 52 of the lower connection pins 50. That is, the rear end portions 42 of the upper connection pins 40 and the rear end portions 52 of the lower connection pins 50 are opposed to each other across a gap, and the end of the module board 5 is inserted between these opposing rear end portions 42 and 52. In other words, the rear end portions 42 and 52 are opposed to each other with the module board 5 sandwiched therebetween.

The rear end portions 42 and 52 respectively include curved portions 42a and 52a curved so as to come close to the module board 5 and contacting the module board 5. As illustrated in FIG. 5A, the curved portion 42a formed in the rear end portion 42 of the upper signal pin S1 contacts a signal pad formed on the front surface 5A of the module board 5 and is soldered to the signal pad. As illustrated in FIG. 5B, the curved portion 42a formed in the rear end portion 42 of the upper ground pin G1 contacts a ground pad formed on the front surface 5A of the module board 5 and is soldered to the ground pad. As illustrated in FIG. 5A, the curved portion 52a formed in the rear end portion 52 of the lower signal pin S2 contacts a signal pad formed on the back surface 5B of the module board 5 and is soldered to the signal pad. As illustrated in FIG. 5B, the curved portion 52a formed in the rear end portion 52 of the lower ground pin G2 contacts a ground pad formed on the back surface 5B of the module board 5 and is soldered to the ground pad.

Further, a flat portion 42c extending along the front surface 5A of the module board 5 is formed between a terminal end 42b of each rear end portion 42 and the curved portion 42a. Similarly, a flat portion 52c extending along the back surface 5B of the module board 5 is formed between a terminal end 52b of each rear end portion 52 and the curved portion 52a. These flat portions 42c and 52c are grip portions pinched in attaching the upper connection pins 40 and the lower connection pins 50 to the connector housing 11. In this regard, the flat portions 42c and 52c make it easier to attach the upper connection pins 40 and the lower connection pins 50 to the connector housing 11. However, the flat portions 42c and 52c are not indispensable components of the present invention.

Figure 6A:
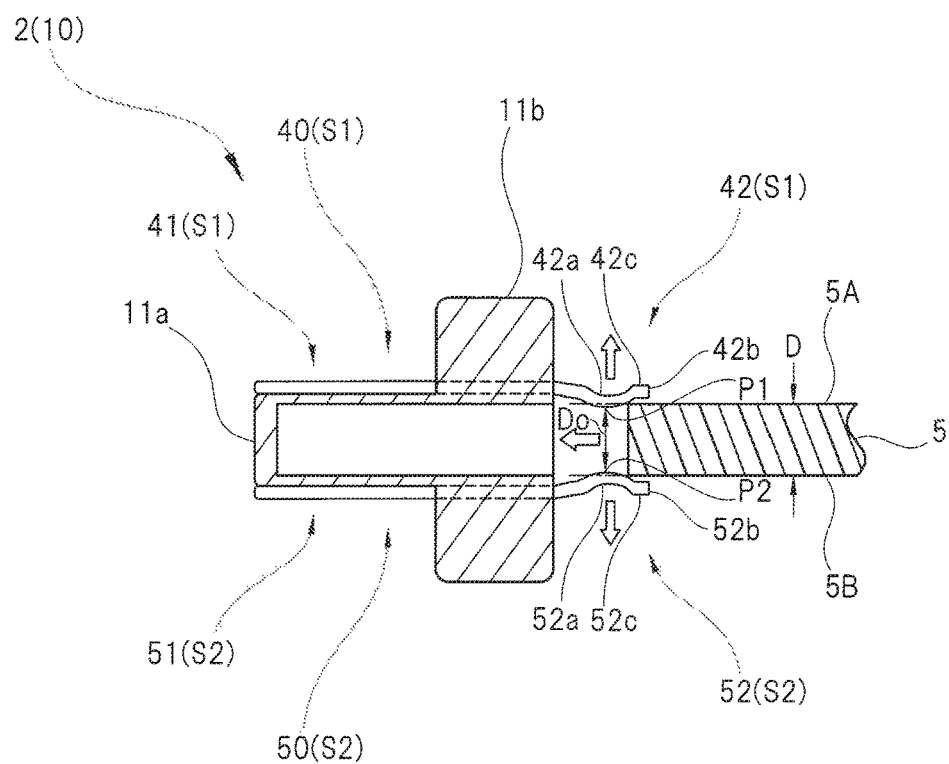
FIG. 6A is an enlarged cross-sectional view illustrating how the upper signal pins and the lower signal pins elastically deform when the end of the module board is inserted.
Figure 6B:
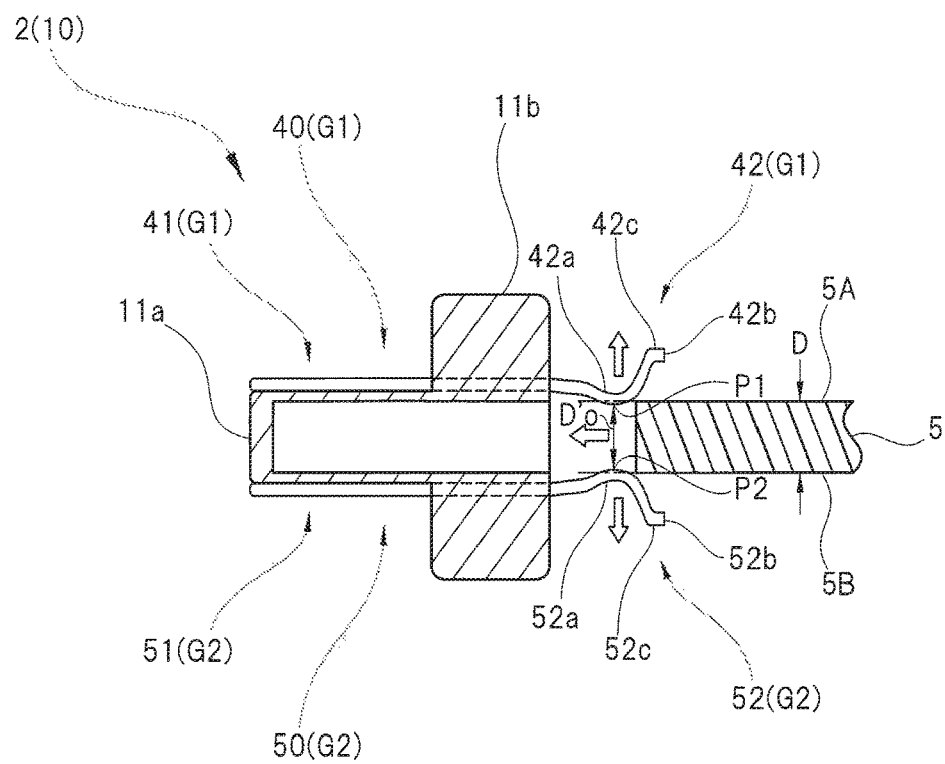
FIG. 6B is an enlarged cross-sectional view illustrating how the upper ground pins and the lower ground pins elastically deform when the end of the module board is inserted.

As illustrated in FIGS. 6A and 6B, before the end of the module board 5 is inserted between the rear end portions 42 and 52, each opposing interval ($D_0$, $D_0'$) defining a distance between innermost surfaces of the rear end portions 42 and 52 is narrower than a thickness (D) of the module board 5 (D>$D_0$, $D_0'$). Note that the thickness of the module board 5 according to the present embodiment is 0.8 mm. More specifically, an opposing interval between a lowest point P1 of the curved portion 42a and a lowest point P2 of the curved portion 52a is narrower than the thickness of the module board 5. Hence, the end of the module board 5 inserted between the rear end portions 42 and 52 enters between the rear end portions 42 and 52 while pushing away the rear end portions 42 and 52 in a direction in which the rear end portions 42 and 52 move away from each other. In other words, the module board 5 enters between these rear end portions 42 and 52 while expanding the opposing interval between the rear end portions 42 and 52. Hence, after the end of the module board 5 is inserted between the rear end portions 42 and 52, the rear end portions 42 and 52 come into pressure contact with the module board 5 by elastic restoring forces of the rear end portions 42 and 52. More specifically, as illustrated in FIGS. 5A and 5B, the lowest points P1 of the curved portions 42a of the rear end portions 42 of the upper signal pins S1 and the upper ground pins G1 come into pressure contact with the connection pads (the signal pads or the ground pads) formed on the front surface 5A of the module board 5. The lowest points P2 of the curved portions 52a of the rear end portions 52 of the lower signal pins S2 and the lower ground pins G2 come into pressure contact with the connection pads (the signal pads or the ground pads) formed on the back surface 5B of the module board 5.

Next, a positional relation between the module board 5 and each of the rear end portions 42 and 52 after the end of the module board 5 is inserted to a predetermined position between the rear end portions 42 and 52 will be described with reference to FIGS. 7A and 7B. That is, the positional relation between the module board 5 and each of the rear end portions 42 and 52 in the communication module 1 will be described.

Figure 7A:
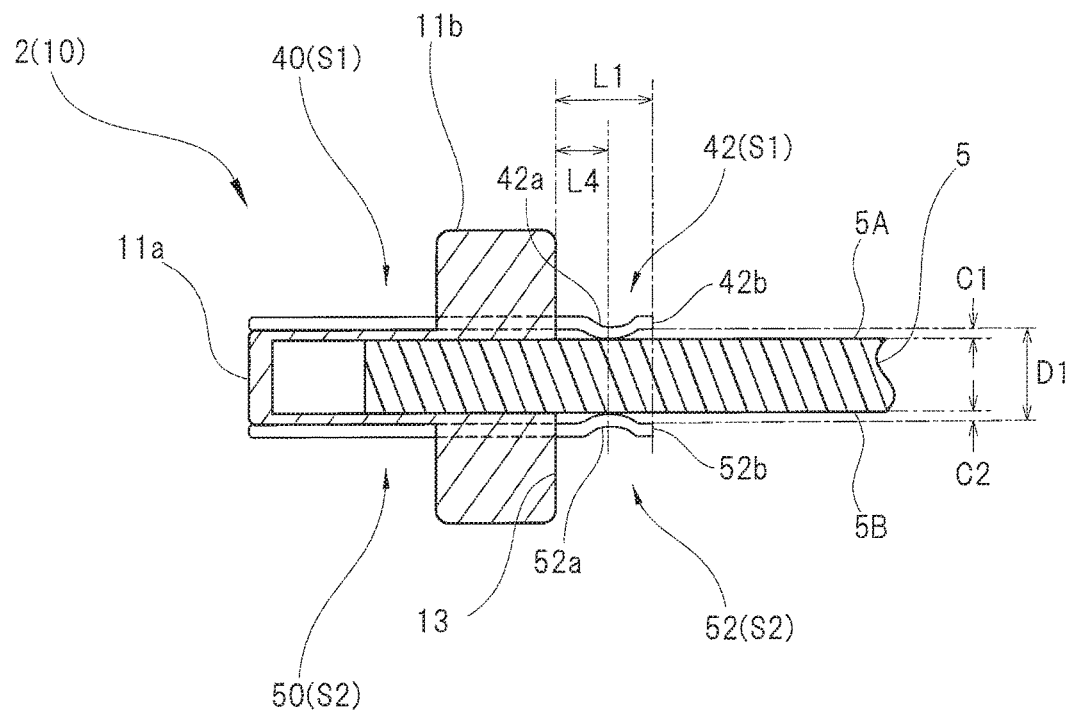
FIG. 7A is an enlarged cross-sectional view illustrating a positional relation between the upper signal pins and the lower signal pins, and the module board.
Figure 7B:
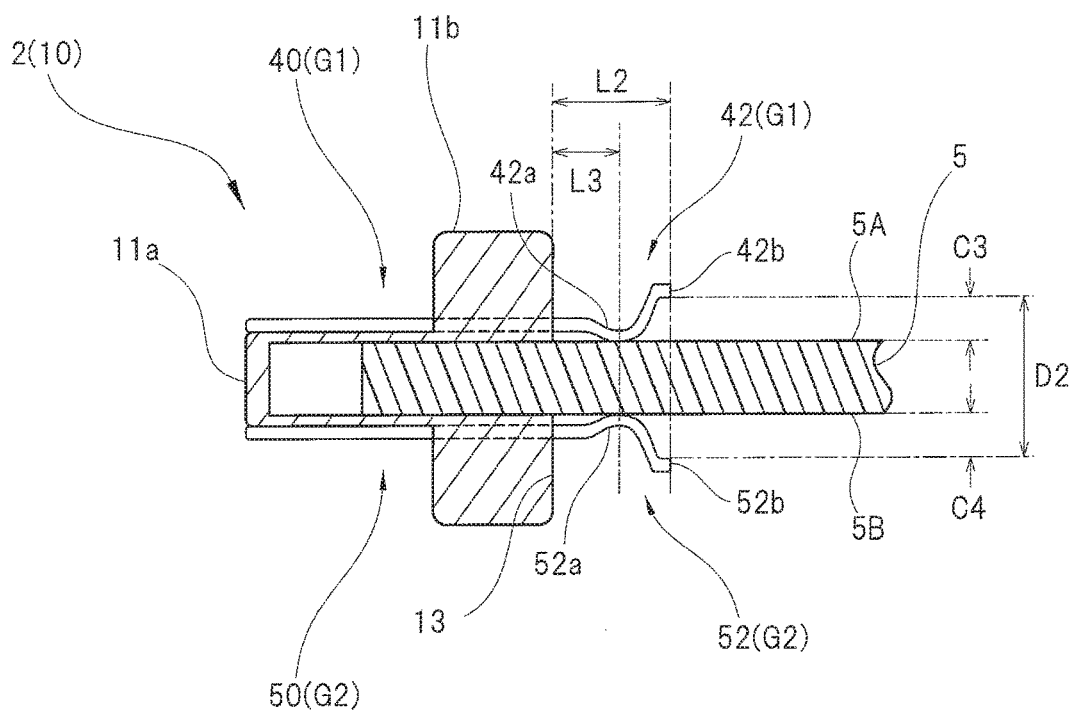
FIG. 7B is an enlarged cross-sectional view illustrating a positional relation between the upper ground pins and the lower ground pins, and the module board.

As illustrated in FIG. 7A, a gap (C1) is between a lower end of the terminal end 42b of the rear end portion 42 of the upper signal pin S1 and the top surface 5A of the module board 5, and a gap (C2) is between an upper end of the terminal end 52b of the rear end portion 52 of the lower signal pin S2 and the bottom surface 5B of the module board 5. Meanwhile, as illustrated in FIG. 7B, a gap (C3) is between a lower end of the terminal end 42b of the rear end portion 42 of the upper ground pin G1 and the top surface 5A of the module board, and a gap (C4) is between an upper end of the terminal end 52b of the rear end portion 52 of the lower ground pin G2 and the bottom surface 5B of the module board 5. Further, the gap (C1) and the gap (C2) have substantially the same size (C1=C2), and the gap (C3) and the gap (C4) have substantially the same size (C3=C4). Meanwhile, the gap (C3) is larger than the gap (C1), that is C3>C1, and the gap (C4) is larger than the gap (C2), that is C4>C2. Hence, an opposing interval (D2) defining a distance between the lower end of the terminal end 42b of the rear end portion 42 of the upper ground pin G1 and the upper end of the terminal end 52b of the rear end portion 52 of the lower ground pin G2 is larger than an opposing interval (D1) defining a distance between the lower end of the terminal end 42b of the rear end portion 42 of the upper signal pin S1 and the upper end of the terminal end 52b of the rear end portion 52 of the lower signal pin S2 (D2>D1). Note that the gaps C1 and C2 in the present embodiment are 0.3 to 0.5 mm and the gaps C3 and C4 are 0.8 to 1.0 mm.

That is, a gap larger than the gap between the terminal end 42b of the upper signal pin S1 and the terminal end 52b of the lower signal pin S2 is formed between the terminal end 42b of the upper ground pin G1 and the terminal end 52b of the lower ground pin G2.

Further, a distance (L2) from the back end surface 13 of the flange portion 11b to an end surface of the terminal end 42b of the upper ground pin G1 and to an end surface of the terminal end 52b of the lower ground pin G2 is longer than a distance (L1) from the back end surface 13 of the flange portion 11b to the end surface of the terminal end 42b of the upper signal pin S1 and to the end surface of the terminal end 52b of the lower signal pin S2 (L2>L4). Furthermore, a distance (L3) from the back end surface 13 of the flange portion 11b to a center of a contact point between the curved portion 42a of the upper ground pin G1 and the module board 5 and to a center of a contact point between the curved portion 52a of the lower ground pin G2 and the module board 5 is longer than a distance (L4) from the back end surface 13 of the flange portion 11b to a center of a contact point between the curved portion 42a of the upper signal pin S1 and the module board 5 and to a center of a contact point between the curved portion 52a of the lower signal pin S2 and the module board 5 (L3>L4). In this regard, the distances (L2), (L3), and (L4) are linear distances along a principal surface of the module board 5. Further, the distance (L4) corresponds to a distance from the back end surface 13 of the flange portion 11b to the lowest point P1 (see FIG. 5A)

of the curved portion 42a of the upper signal pin S1 and to the lowest point P2 (see FIG. 5A) of the curved portion 52a of the lower signal pin S2. The distance (L3) corresponds to a distance from the back end surface 13 of the flange portion 11b to the lowest point P1 (FIG. 5B) of the curved portion 42a of the upper ground pin G1 and to the lowest point P2 (FIG. 5B) of the curved portion 52a of the lower ground pin G2.

As described above, the opposing interval (D2) between the terminal end 42b of the rear end portion 42 of the upper ground pin G1 and the terminal end 52b of the rear end portion 52 of the lower ground pin G2 is larger than the opposing interval (D1) between the terminal end 42b of the rear end portion 42 of the upper signal pin S1 and the terminal end 52b of the rear end portion 52 of the lower signal pin S2. Further, the distance (L2) from the back end surface 13 of the flange portion 11b to the terminal end 42b of the upper ground pin G1 and to the terminal end 52b of the lower ground pin G2 is longer than the distance (L1) from the back end surface 13 of the flange portion 11b to the terminal end 42b of the upper signal pin S1 and to the terminal end 52b of the lower signal pin S2. In other words, the respective terminal ends 42b and 52b of the upper and lower ground pins G1 and G2 are positioned closer to a front side in the insertion direction of the module board 5 than the respective terminal ends 42b and 52b of the upper and lower signal pins S1 and S2. Consequently, it is possible to easily avoid an interference between the respective terminal ends 42b and 52b of the upper and lower ground pins G1 and G2, and the module board 5 when the module board 5 is inserted between the rear end portions 42 and 52. Further, after the end of the module board 5 is inserted between the respective terminal ends 42b and 52b of the upper and lower ground pins G1 and G2, the respective terminal ends 42b and 52b of the upper and lower ground pins G1 and G2 function as guides. Consequently, it is possible to smoothly insert the end of the module board 5 between the respective terminal ends 42b and 52b of the upper and lower signal pins S1 and S2.

Meanwhile, the gap (C1) between the terminal end 42b of the upper signal pin S1 and the front surface 5A of the module board 5, and the gap (C2) between the terminal end 52b of the lower signal pin S2 and the back surface 5B of the module board 5 are narrow. This prevents the rear end portions 42 and 52 from becoming stubs and causing deterioration of electric characteristics.

That is, the opposing interval between the terminal end 42b of the upper ground pin G1 and the terminal end 52b of the lower ground pin G2 is widened to facilitate assembling of the plug connector 10, and the opposing interval between the terminal end 42b of the upper signal pin S1 and the terminal end 52b of the lower signal pin S2 is kept narrow to avoid deterioration of electric characteristics.

In addition, the distance (=L3) from the back end surface 13 of the flange portion 11b to the lowest point P1 of the curved portion 42a of the upper ground pin G1 and to the lowest point P2 of the curved portion 52a of the lower ground pin G2 is longer than the distance (=L4) from the back end surface 13 of the flange portion 11b to the lowest point P1 of the curved portion 42a of the upper signal pin S1 and to the lowest point P2 of the curved portion 52a of the lower signal pin S2. Consequently, the end of the module board 5 inserted between the rear end portions 42 and 52 contacts the respective curved portions 42a and 52a of the upper and lower ground pins G1 and G2, and then, contacts the respective curved portions 42a and 52a of the upper and lower signal pins S1 and S2. That is, when the module board 5 is inserted between the upper and lower connection pins, some of the connection pins are elastically deformed first, and then, the others are elastically deformed, without elastically deforming all connection pins simultaneously. Consequently, an insertion resistance of the module board 5 is reduced. Further, some of the connection pins elastically deformed first restrict a motion of the module board 5, whereby a subsequent insertion direction can be stabilized.

The present invention is not to be limited to the embodiment and may be modified in various ways within a scope not deviating from the gist thereof. For example, in the embodiment, a part of the module board 5 is inserted in the connector housing 11 to fix both strongly and precisely. However, if it is possible to fix the module board 5 and the connector housing 11 while keeping necessary strength and precision, it is not necessary to insert a part of the module board 5 in the connector housing 11.

Meanwhile, when a part of the module board 5 is inserted in the connector housing 11, it is possible to arbitrarily change an insertion length. By way of example, the insertion end 5a may be inserted in the board insertion portion 14 until the leading end surface 5b of the insertion end 5a illustrated in FIG. 4 abuts on the bottom surface 14a of the board insertion portion 14. In this case, the insertion end 5a is interposed between the upper connection pins 40 and the lower connection pins 50 over the entire length of the upper connection pins 40 and the lower connection pins 50, so that an effect of further reducing crosstalk can be expected.

The pitches between the upper connection pins 40 and the lower connection pins 50 are not limited to 0.5 mm. Further, pin pitches are not limited to equal pitches. For example, pitches between the signal pins S1 and pitches between the ground pins G1 may be different according to an embodiment, or pitches between the signal pins S1 are wider than pitches between the signal pins S1 and the ground pins G1 according to another embodiment. Meanwhile, from a viewpoint of mounting the communication module 1 at high density, the pin pitches are preferably 0.7 mm or less.

The present invention is applicable not only to a communication module for optical communication but also to a communication module for telecommunications. For example, the optical fiber 3 illustrated in FIG. 1 and the like may be changed to metal lines.

What is claimed is:

1. A communication module comprising a plug connector connected to a receptacle connector of a communication apparatus,
wherein the plug connector includes:
an insertion projection portion inserted in the receptacle connector;
a flange portion including a front end surface to which the insertion projection portion is continuously connected, and a back end surface opposite to the front end surface;
a plurality of first connection pins each including a first front end portion and a first rear end portion, the first front end portion protruding from the front end surface of the flange portion and extending along an upper surface of the insertion projection portion, and the first rear end portion protruding from the back end surface of the flange portion;
a plurality of second connection pins each including a second front end portion and a second rear end portion, the second front end portion protruding from the front end surface of the flange portion and extending along a lower surface of the insertion projection portion, and the second rear end portion protruding from the back end surface of the flange portion and opposing the first rear end portion across a gap; and a board inserted into the gap between surfaces of the first rear end portion of the first connection pin and the second rear end portion of the second connection pin that face each other, wherein the plurality of first connection pins and the plurality of second connection pins include signal pins each connected to a signal line arranged in the board, and ground pins each connected to a ground line arranged in the board, wherein a distance between an innermost portion of a terminal end of the first rear end portion of each of the ground pins included in the first connection pins and an innermost portion of a terminal end of the second rear end portion of each of the ground pins included in the second connection pins is longer than a distance between an innermost portion of a terminal end of the first rear end portion of each of the signal pins included in the first connection pins and an innermost portion of a terminal end of the second rear end portion of each of the signal pins included in the second connection pins, wherein a curved portion that is curved so as to come close to the board and contacts the board is provided at each of the first and second rear end portions of the signal and ground pins, wherein a distance from the back end surface of the flange portion to a contact point between the curved portion of each of the ground pins and the board is longer than a distance from the back surface of the flange portion to a contact point between the curved portion of each of the signal pins and the board, and wherein the board contacts the curved portion of each of the ground pins, and then contacts the curved portion of each of the signal pins when inserted into the gap between the first rear end portion of each of the first connection pins and the second rear end portion of each of the second connection pins.

2. The communication module according to claim 1, wherein a distance from the back end surface of the flange portion to the terminal end of each of the first and second rear end portions of the ground pins is longer than a distance from the back end surface of the flange portion to the terminal end of each of the first and second rear end portions of the signal pins.

3. The communication module according to claim 1, wherein a flat portion extending along the board is formed between the terminal end of each of the first and second rear end portions of the signal pins and the ground pins.

4. The communication module according to claim 2, wherein a flat portion extending along the board is formed between the curved portion and the terminal end of each of the first and second rear end portions of each of the signal pins and the ground pins.

5. The communication module according to claim 1, wherein a gap between the terminal end of each of the ground pins included in the first connection pins and a front surface of the board is larger than a gap between the terminal end of each of the signal pins included in the first connection pins and a back surface of the board, and a gap between the terminal end of each of the ground pins included in the second connection pins and the front surface of the board is larger than a gap between the terminal of each of the signal pins included in the first connection pins.

6. A method of assembling a plug connector that the communication module according to claim 1 has, the method comprising:

elastically deforming the ground pins, and then elastically deforming the signal pins when the board is inserted into the gap.

7. The method of assembling a plug connector according to claim 6, further comprising restricting a motion of the board by the elastic deformation of the ground pins.

* * * * *